United States Patent [19]

Blasingame et al.

[11] Patent Number: 5,414,254

[45] Date of Patent: May 9, 1995

[54] OPTICAL SWITCH WITH TAMPER INDICATING FEATURE FOR DISCOURAGING THE USE OF AN EXTERNAL LIGHT SOURCE TO DEFEAT THE INTENDED OPERATION OF THE OPTICAL SWITCH

[75] Inventors: Ray W. Blasingame, Richardson; James H. May, McKinney, both of Tex.

[73] Assignee: Honeywell Inc., Minneapolis, Minn.

[21] Appl. No.: 52,089

[22] Filed: Apr. 22, 1993

[51] Int. Cl.⁶ .............................................. G01J 1/32
[52] U.S. Cl. ..................................... 250/205; 250/221; 315/150; 327/514
[58] Field of Search ............... 250/205, 221; 307/311; 315/149–150

[56] References Cited

U.S. PATENT DOCUMENTS

| | | | |
|---|---|---|---|
| 4,520,262 | 5/1985 | Denton | 250/221 |
| 4,808,809 | 2/1989 | Hayakawa | 250/205 |
| 4,998,043 | 3/1991 | Unami et al. | 315/151 |
| 5,298,800 | 3/1994 | Dunlop et al. | 307/311 |

Primary Examiner—Stephone B. Allen
Attorney, Agent, or Firm—William D. Lanyi

[57] ABSTRACT

An optical switch, or detector, is provided with a light source and a light sensitive component. The light source, which can be an infrared light emitting diode, and the light sensitive component, which can be a photodarlington pair, are associated to provide an equilibrium light emission from the light emitting diode which is sufficient to maintain conductance through the light sensitive component which regulates the amount of current flowing through the light emitting diode. This cooperative association between these components results in an equilibrium condition that is disturbed by the existence of an object between these components to obstruct the light beam between the light source and the light sensitive component, or an external light source providing a beam of light received by the light sensitive component. The voltage magnitude at the light source can be used as a signal representing the condition as the light sensitive component. In other words, if an object blocks the light beam between the light source and the photodarlington pair, the voltage at the light source is caused to rise to a predetermined magnitude. If, on the other hand, external light is received by the light sensitive component, the voltage at the light source will drop to a recognizably low magnitude and permit a tampering attempt to be detected.

10 Claims, 8 Drawing Sheets

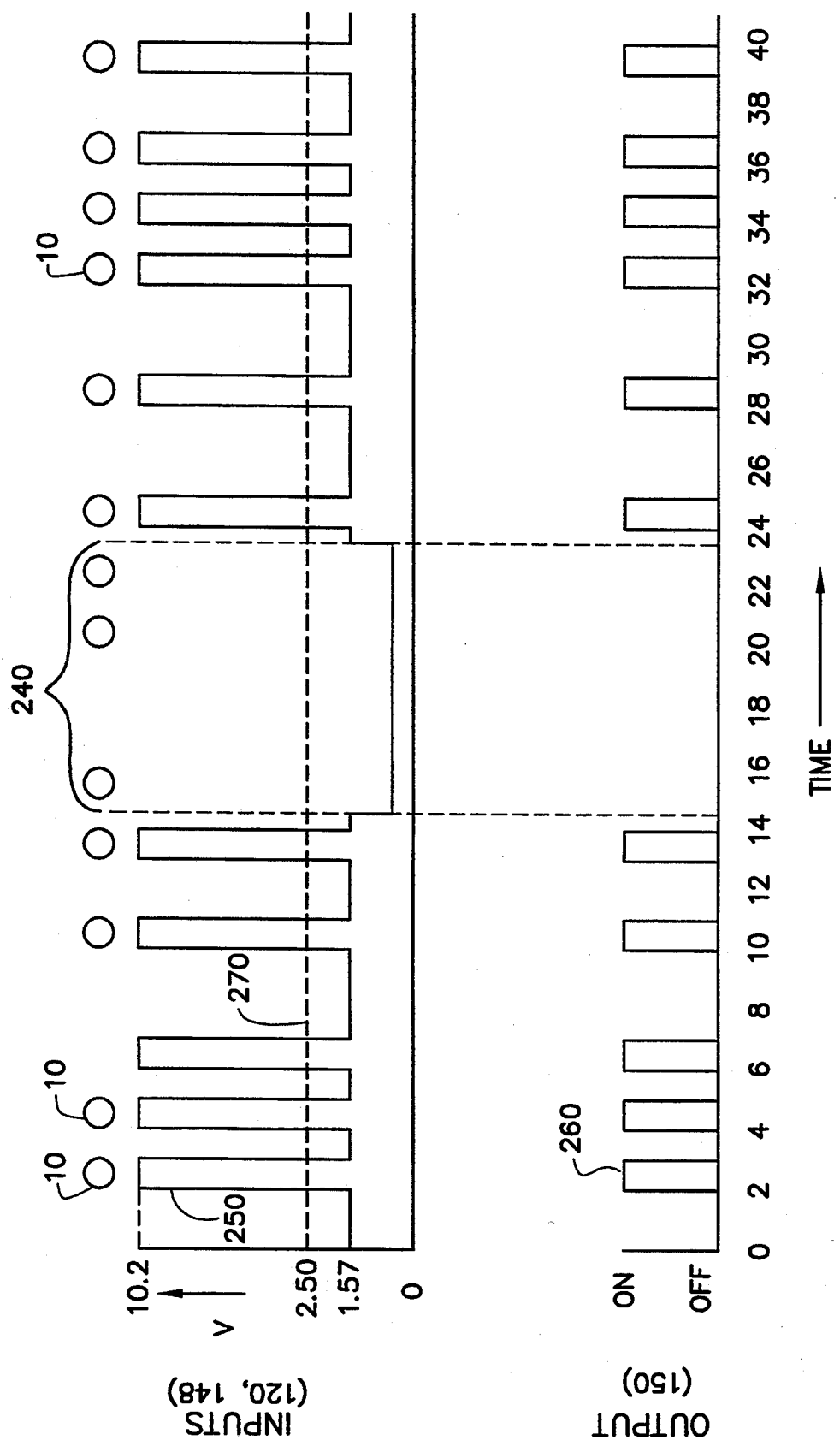

OPTICAL SWITCH WITH TAMPER INDICATING FEATURE FOR DISCOURAGING THE USE OF AN EXTERNAL LIGHT SOURCE TO DEFEAT THE INTENDED OPERATION OF THE OPTICAL SWITCH

BACKGROUND OF THE INVENTION

1. Field of the Invention

The present invention is generally related to optical switches and, more particularly, to an optical switch which is provided with a tamper indicating feature that recognizes the existence of light received by the optical switch from an external light source.

2. Description of the Prior Art

In many different types of applications, it is necessary to count objects as they move past a predetermined location. For example, in certain document counting systems, a light source and a light sensitive component are arranged to define a detection zone therebetween. As objects pass between the light source and the light sensitive component, the light path between these devices is obstructed. The obstructions can be counted so that the number of objects passing along a preselected path can be determined.

One particular application of this type of apparatus is in a gambling device such as a slot machine. Gambling devices of this type are typically provided with an automatic means for dispensing coins to a player as winnings. Optical switches permit the rapid dispensing of coins while also providing signals that can be counted as the coins are dispensed to the winning player. Although optical switches can be used in many different types of applications, the provision of a tamper detection capability in association with an optical switch is particularly important when the switch is employed in a device such as a slot machine where the effect of successful tampering can be extremely costly.

Several systems have been developed in recent years to LO prevent the successful tampering with optical switches in gambling devices. These prior art systems are described below in conjunction with FIGS. 2, 3 and 4.

SUMMARY OF THE INVENTION

The present invention provides an optical switch, or optical detector, that comprises a light source and a light sensitive component which is disposed at a position to receive light from the light source. The detector further comprises a means for regulating the intensity of the light emanating from the light source as a function of the intensity of light received by the light sensitive component. In other words, as the light received by the light sensitive components diminishes, the light source is provided with an increased voltage which raises the intensity of light emanating from the light source. In a preferred embodiment of the present invention, the light source is a light emitting diode and the light sensitive component is a phototransistor, such as a photodarlington pair. The regulating means comprises a transistor which has its base connected in electrical communication with the phototransistor. In addition, the emitter and collector of the transistor are connected between a power supply and the light source. In operation, the phototransistor is connected between the power supply and ground and increased conductance of the phototransistor, in response to an increased light intensity received by it, causes a reduced resistance between the power supply and ground and therefore reduces the voltage at the base of the transistor. This relationship regulates the current flowing through the light source. On the other hand, a decreased light intensity received by the phototransistor raises the resistance between the power supply and ground and therefore increases the voltage at the base of the transistor. When the base current of the transistor increases, more current is permitted to flow through the transistor to the light source. This raises the light intensity emanating from the light source.

In a preferred embodiment of the present invention, the detector comprises a first means for comparing a first voltage at the light source to a first reference voltage and further comprises a second means for comparing a second voltage at the light source to a second reference voltage. The detector also comprises a first means for providing first signal when the first voltage exceeds the first reference and a second means for providing a second signal when the second voltage is less than the second reference. A means is provided for delaying a change in the level of the second signal upon an increase of the second voltage following a period of time when the second voltage was less than the second reference. This delaying means provides an important aspect of the present invention which permits it to send a recognizable signal to an external component to indicate that a tampering effort has been made. The first signal is representative of an obstruction of the light path, such as the passage of a coin, between the light source and the light sensitive component and the second signal is representative of a light other than the light source emanating light which is received by the light sensitive component.

BRIEF DESCRIPTION OF THE DRAWINGS

The present invention will be more fully understood from a reading of the Description of the Preferred Embodiment in conjunction with the drawings, in which.

DESCRIPTION OF THE PREFERRED EMBODIMENT

Figure 1:
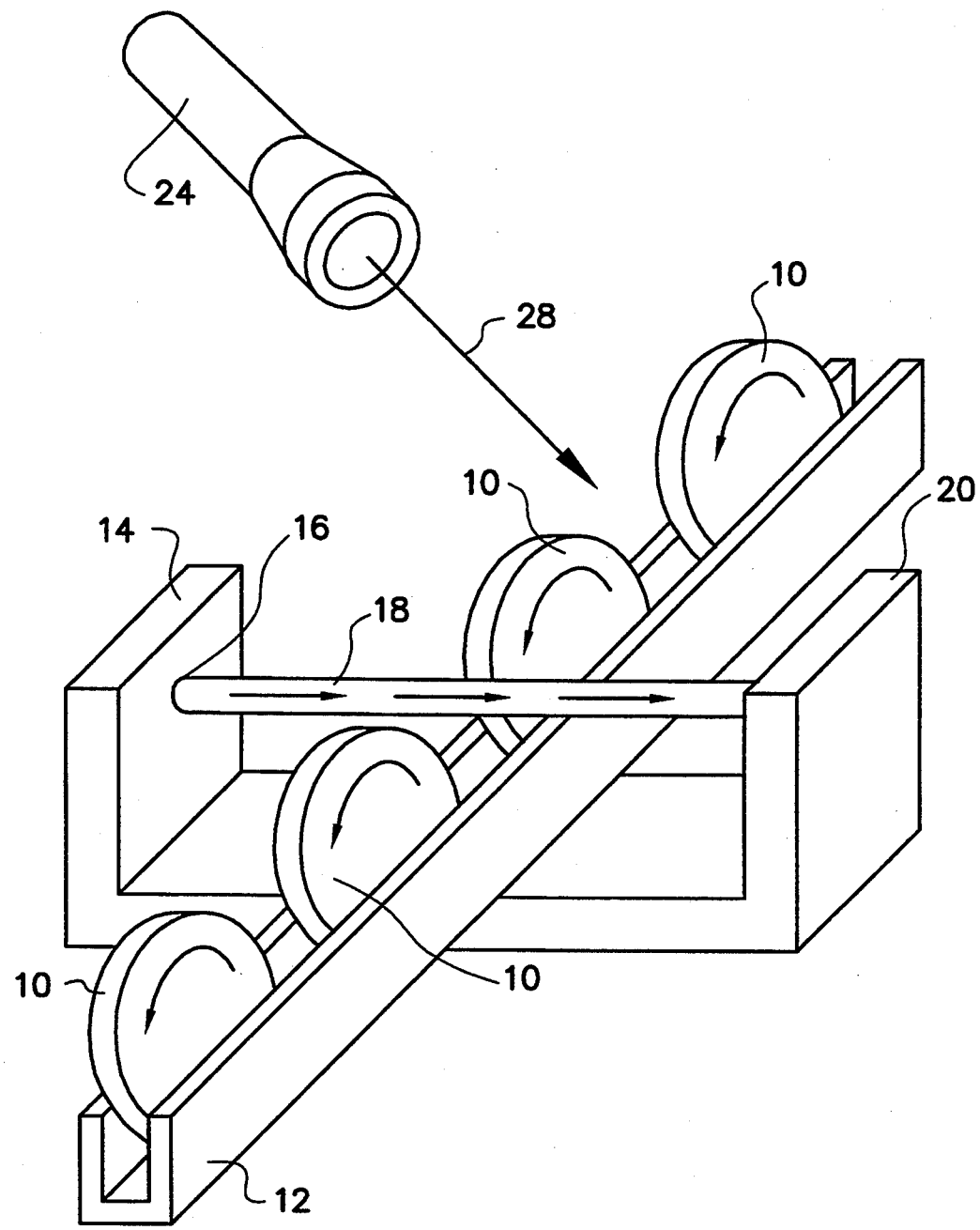
FIG. 1 illustrates an exemplary arrangement by which moving objects can be detected and counted.

Throughout the Description of the Preferred Embodiment, like components will be identified by like reference numerals. FIG. 1 is an exemplary illustration of a typical circumstance in which an optical switch or detector can be used. If a number of objects, such as coins 10, are to be counted, they can be caused to move along a predetermined path. For example, the channel 12 is arranged to guide the rolling objects 10 between two portions of an optical switch. A first portion 14 contains a light source therein which can be directed through an opening 16. The emanation of light from the first portion 14 can create a light beam 18 which passes through a detection zone toward a second portion 20 which contains a light sensitive component. The zone of detection is defined as the space between the first and second portions, 14 and 20, of the optical switch. If an object passes through the zone of detection and obstructs the passage of the light beam 18, the absence of light on the light sensitive component can provide a signal which indicates the presence of an object in the zone. As long as a minimal space exists between the objects 10, the sequential presence and absence of light at the light sensitive component in the second portion 20 permits the counting of the objects as they pass through the zone of detection.

The device shown in FIG. 1 is subject to tampering if a light from an external source, such as the exemplary flashlight 24, is received by the light sensitive component within the second portion 20 of the detector. If a continuous beam of light 28 is received by the light sensitive component, it can possibly be interpreted by associated circuitry to indicate that light beam 18 was never broken by the object 10. In a gambling device, such as a slot machine, this can have highly disadvantageous results if the associated circuitry of the gambling device can be mislead into reacting as if no coins were distributed through the zone of detection. This misinterpretation of the situation, which results from the continuous existence of light from the external source 24, can cause the gambling device to continue to dispense coins in excess of the appropriate amount required under the circumstances. It would therefore be highly beneficial if a circuit for an optical switch can distinguish between light received along light beam 18 from a particular light emitting diode in the first portion 14 from light received from an external source.

Figure 2:
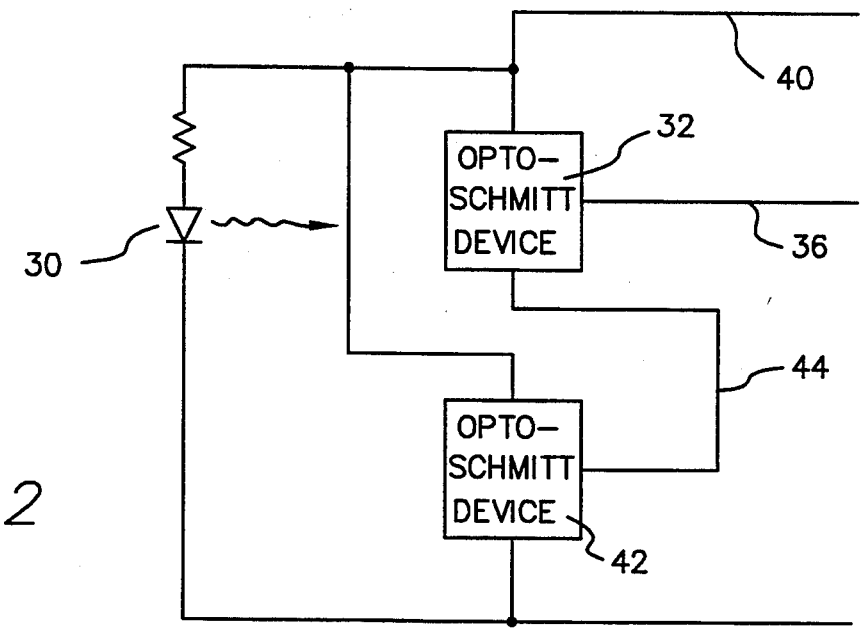
FIG. 2 illustrates a known circuit for use with an optical switch.

As discussed above, many different types of circuits have been developed for the purpose of defeating or detecting attempts to tamper with the operation of an optical switch through the use of an external light. FIG. 2 illustrates one attempt to provide a tamper detection system. A light emitting diode 30 is arranged to cause light to be emanated in the direction of an opto-schmitt device 32 which provides an output signal on line 36 in response to receipt of light. The opto-schmitt device 32 receives power from line 40. A second opto-schmitt device 42 is located at a position where in can not receive light from light emitting diode 30, but would receive light provided from an external source in the general direction of the optical switch. If light is received by opto-schmitt device 42, it provides a signal on line 44 to deprive the first opto-schmitt device 32 of a ground path and therefore prevents the transmission of a signal on line 36 if both opto-schmitt devices, 32 and 42, are receiving light at the same time. The circuit in FIG. 2 only provides an output on line 36 if opto-schmitt device 32 is receiving light and opto-schmitt device 42 is not receiving light. In practice, it is difficult to provide an arrangement of the two light sensitive components shown in FIG. 2 at positions which satisfy the required criteria. If they are placed two close together, light emanating from light emitting diode 30 may be received by opto-schmitt device 42 and, if they are placed too far apart, light emanating from an external source may be received by opto-schmitt device 32, but not by opto-schmitt device 42.

Figure 3:
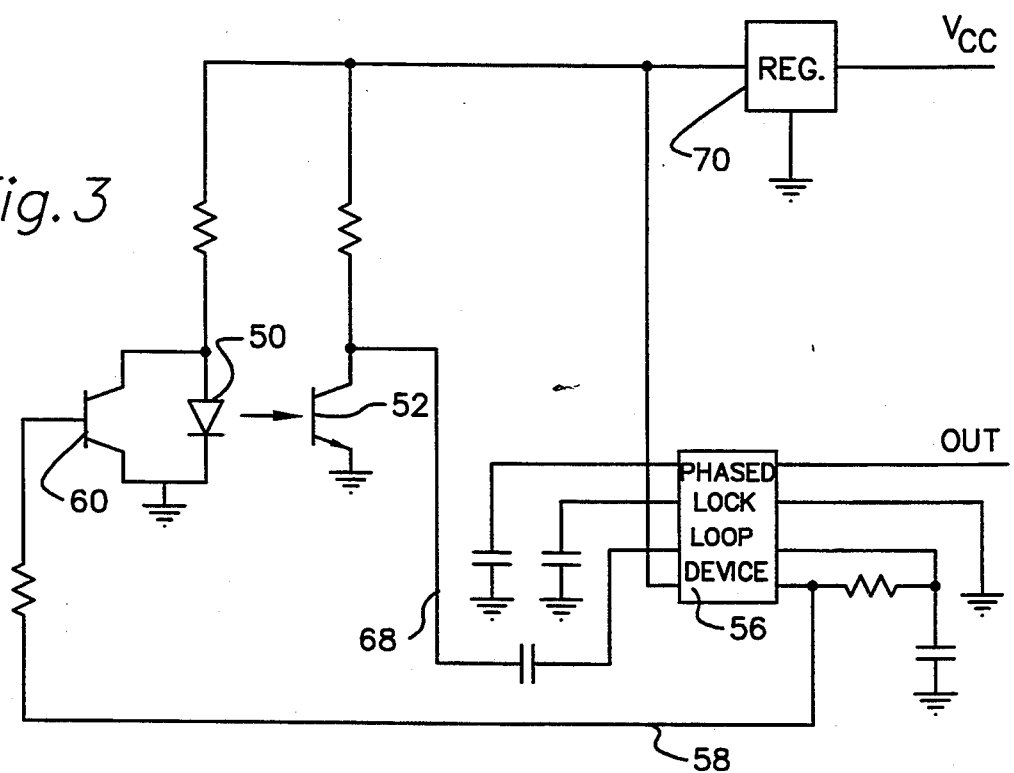
FIG. 3 illustrates another known circuit for use with an optical switch.

FIG. 3 illustrates another attempt to react to the possibility of tampering in a device such as that shown in FIG. 1. A light emitting diode 50 is associated with a light sensitive component 52, such as a phototransistor, to define a zone of detection therebetween. A phased lock loop device 56 provides a periodic signal on line 58 which controls transistor 60 and produces a series of current pulses through light emitting diode 50. This, in turn, creates a series of light pulses through the zone of detection between the light emitting diode 50 and the light sensitive component 52. By synchronizing the receipt of signals, on line 68, to the signals on line 58, the circuit in FIG. 3 attempts to solve the tampering problem described above.

Figure 4A:
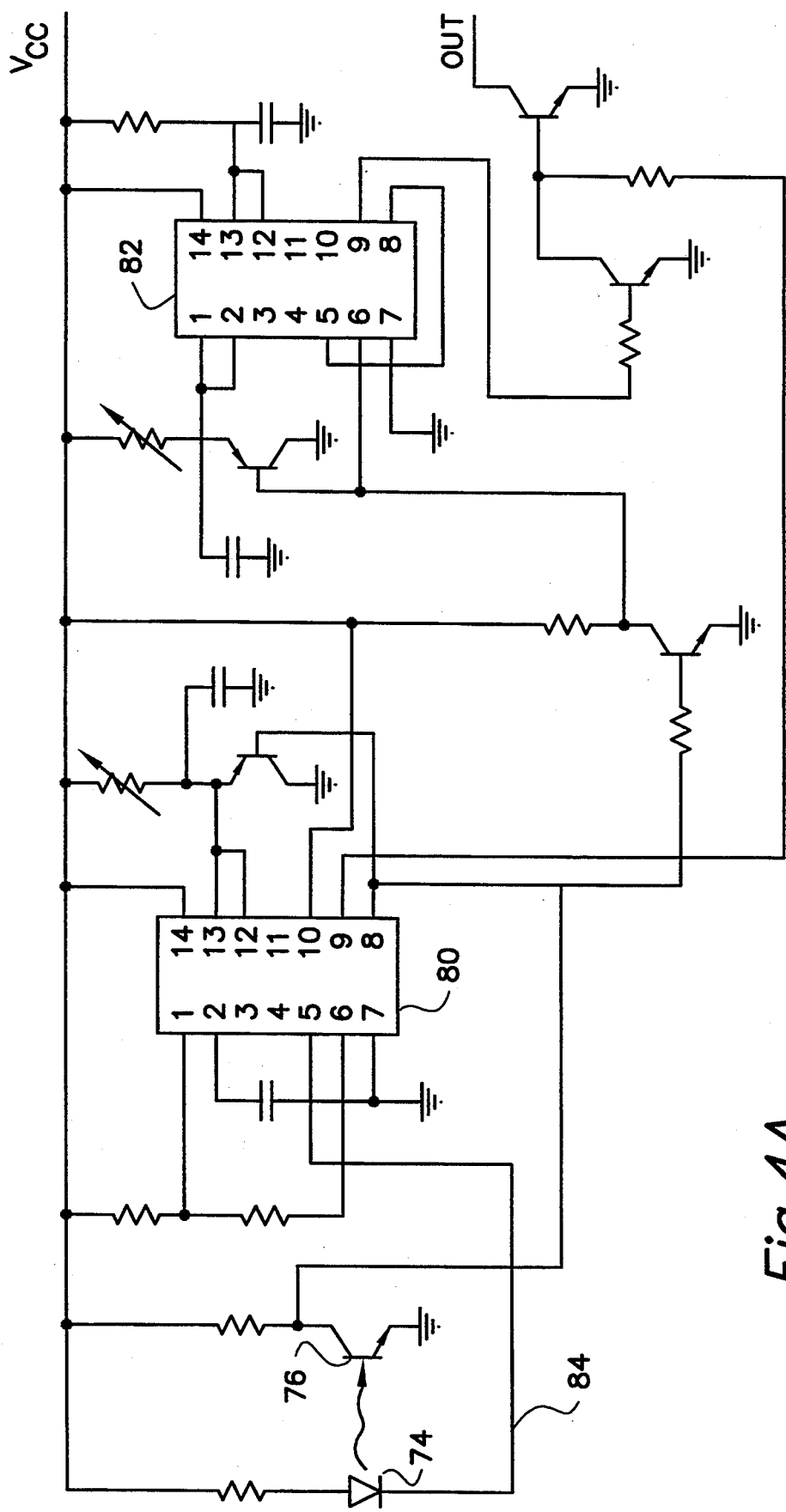
FIGS. 4A and 4B illustrates a third known circuit for use with an optical switch.

FIG. 4A illustrates another circuit provided for the purpose of reacting to tampering attempts in association with optical switches. A light emitting diode 74 is associated with a phototransistor 76 in a manner similar to that described above in conjunction with FIG. 3. The components identified by reference numerals 80 and 82 monitor the received light pulses and compare them to pulses of light from the light emitting diode 74 which result from pulsed current through line 84. Device 80 is intended to detect missing pulses which are caused by the presence of an object, such as a coin, between the light emitting diode and the phototransistor 76. Device 82 is directed to detect the existence of light that is indicative of an attempt to tamper with the normal operation of the optical switch.

Figure 4B:
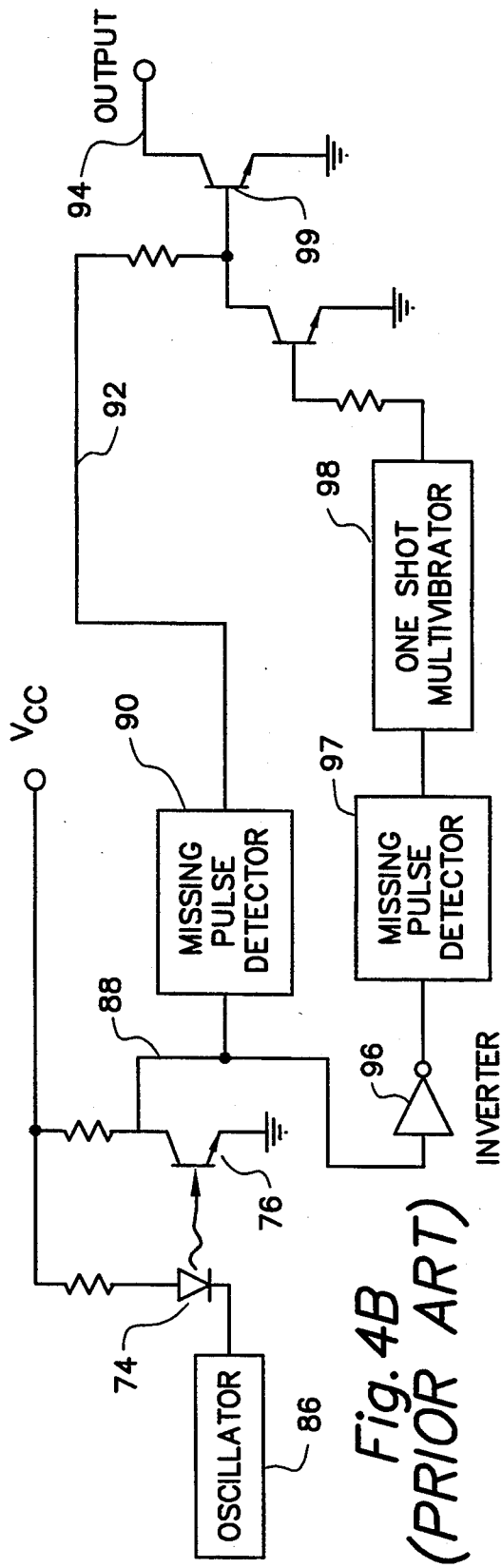

FIG. 4B is a simplified schematic of the circuit shown in FIG. 4A. The free running oscillator 86 drives the light emitting diode 74 which is coupled across a detection zone to the phototransistor 76. The phototransistor 76 follows the LED drive signal unless an obstruction passes between it and the phototransistor 76. The output on line 88 is low when the LED is energized. In an attempt to tamper is made with an external light, the output on line 88 is low until the light is removed. The output on line 88 is connected to a missing pulse detector 90 that is triggered repeatedly by negative edge transitions. If no obstruction, such as a coin, is present in the detection zone the output on line 92 is high. When the light path is obstructed, the missing pulse detector is activated by the lack of retrigger pulses. The output transitions to a low state and holds the sensor output 94 off to produce a high output 108. If an external light source is present, during a tamper attempt, the phototransistor signal on line 88 is held low until the light is removed. This output is inverted by invertor 96 and fed to missing pulse detector 97 which is activated when no negative transitions retrigger it. When the missing pulse detector 97 transitions to a low state, it activates a one shot multivibrator which provides a high output for at least 700 milliseconds which holds the transistor 99 off for at least 700 milliseconds.

Figure 4C:
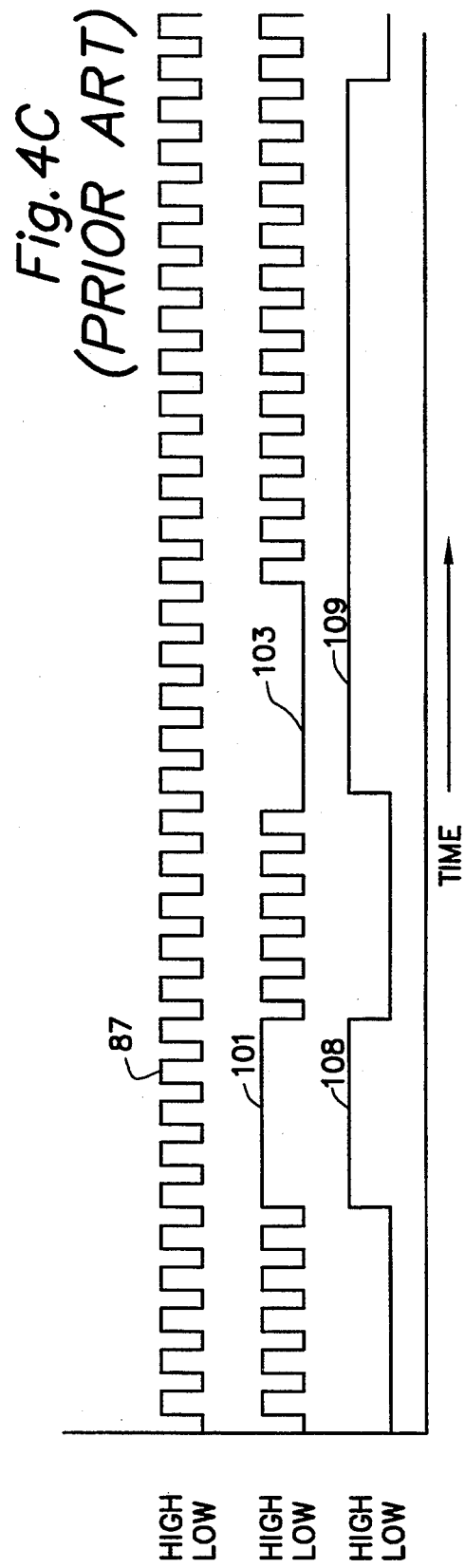
FIG. 4C is a timing chart related to the diagram of FIG. 4B.

FIG. 4C shows the output 87 of the oscillator. The output 89 of the phototransistor 76 reacts to obstructions with extended high signals 101 and reacts to external light with low signals 103. The sensor output responds to obstructions with high signals 108 and to external light with extended high signals 109.

Figure 5:
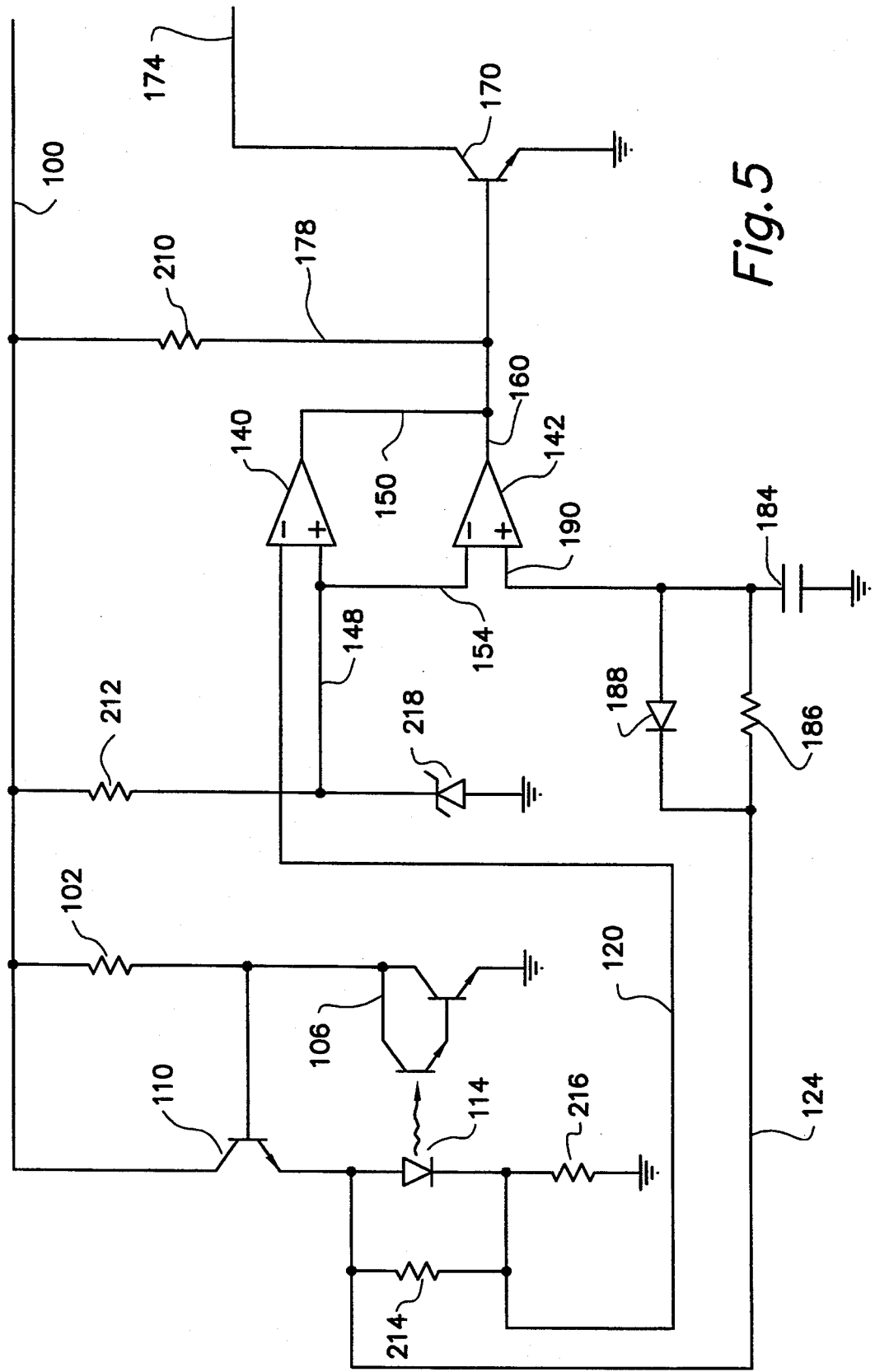
FIG. 5 illustrates the circuit of the present invention.

FIG. 5 illustrates a circuit used in accordance with the preferred embodiment of the present invention. A voltage is provided to the circuit on line 100 from an external power supply. For purposes of this description, it will be assumed that the voltage on line 100 is 16 volts DC. However, it should be understood that the present invention could also be configured to operate with many different voltage potentials. Power provided on line 100 is available, through resistor 102, to a photodarlington component 106. Although different types of light sensitive components can be used in accordance with the present invention, the circuit shown in FIG. 5 utilizes a photodarlington pair connected between resistor 102 and ground. If light is received by the photodarlington pair 106, the voltage potential at the base of transistor ].10 is reduced because of the reduced resistance provided by the photodarlington pair. If, on the other hand, the light received by the photodarlington pair 106 is significantly reduced, its effective resistance is increased and the voltage at the base of transistor 110 is increased. This causes increased conductance through transistor 110 and, as a result, the light emitting diode 114 is subjected to an increased voltage drop across it and an increased current through it. This raises the light intensity emanating from the light emitting diode 114.

With continued reference to FIG. 5, it can be seen that the light emitting diode 114 and light sensitive component 106 respond to each other in such a way that an equilibrium is reached wherein the light emanating from the light emitting diode 114 is regulated to a predetermined magnitude to maintain the two components in a balanced relationship with each other. If the light emanating from light emitting diode 114 increases beyond that equilibrium level, the increased conductance of the light sensitive component 106 will decrease its effective resistance between resistor 102 and ground and therefore reduce the conductance of transistor 110. This, in turn, will reduce the current flowing through light emitting diode 114 and will reduce the intensity of light emanating therefrom. Therefore, it can be seen that under normal conditions, the light emitting diode 114 and the light sensitive component 10,5 will reach an equilibrium association with each other where the light emitting diode will provide an amount of light that is insufficient to diminish its own current supply through transistor 110.

If an obstruction exists between the light emitting diode 114 and the light sensitive component 106, the amount of light received by the light sensitive component 106 will be reduced significantly and its internal resistance to current flow through it will rise significantly. If the light in the detection zone between the light emitting diode and the light sensitive component is blocked, the increased effective resistance of the light sensitive component 106 will cause an increased base current of transistor 110 and the current flowing through light emitting diode 114 will be significantly increased. The increased voltage at the emitter of transistor 110 will result in an increased voltage on line 120. The voltage of line 124 will also be increased in reaction to the increased voltage at the emitter of transistor 110 in response to the increased voltage at the base of that transistor. The voltages on lines 120 and 124 will differ from each other by a potential equivalent to the voltage drop across the parallel combustion of resistor 214 and light emitting diode 114.

With continued reference to FIG. 5, the voltage on line 100 is also used to provide a reference, in cooperation with zener diode 218, for comparators 140 and 142. The reference voltage, on lines 148 and 154, is provided to the noninverting input of comparator 140 and to the inverting input of comparator 142. When the voltage on line 120 rises by a sufficient amount to exceed the voltage on line 148, comparator 140 is turned on and is able to sink current from line 150 to ground.

When the voltage on line 124 drops below the magnitude of the voltage on line 154, comparator ].42 will be turned on and will be able to sink current from line 160. However, as will be described in greater detail below, the voltage on line 124 is higher than the voltage on line 154 except when light from an external source is received by light sensitive component 106.

During normal operation of the circuit shown in FIG. 5, a small magnitude of current flows through transistor 170 under normal operating conditions. This connects the output line 174 to ground through transistor 170. However, if either comparator, 140 or 142, is in an on condition, the current from line 178 will flow to the comparator which is on which will sink the current to ground. That will prevent the base of transistor 170 from receiving its required current to turn it on. Output line 174 will then rise in voltage to a value determined by circuitry at an external device connected to it. In other words, the signal on line 174 will rise to a voltage which is determined by the components connected to line 174 at an apparatus with which the present invention is associated. The circuit shown in FIG. 5 provides an output signal by connecting line 174 to ground through transistor 170 or depriving line 174 from that connection.

With continued reference to FIG. 5, the capacitor 184 provides a delay in the voltage rise at the noninverting input of comparator 142. In other words, when line 124 rises from a low voltage to a higher voltage, capacitor 184 and its associated components, resistor 186 and diode 188, delay the corresponding rise in voltage at line 190 which is connected to the noninverting input of the comparator.

Figure 6B:
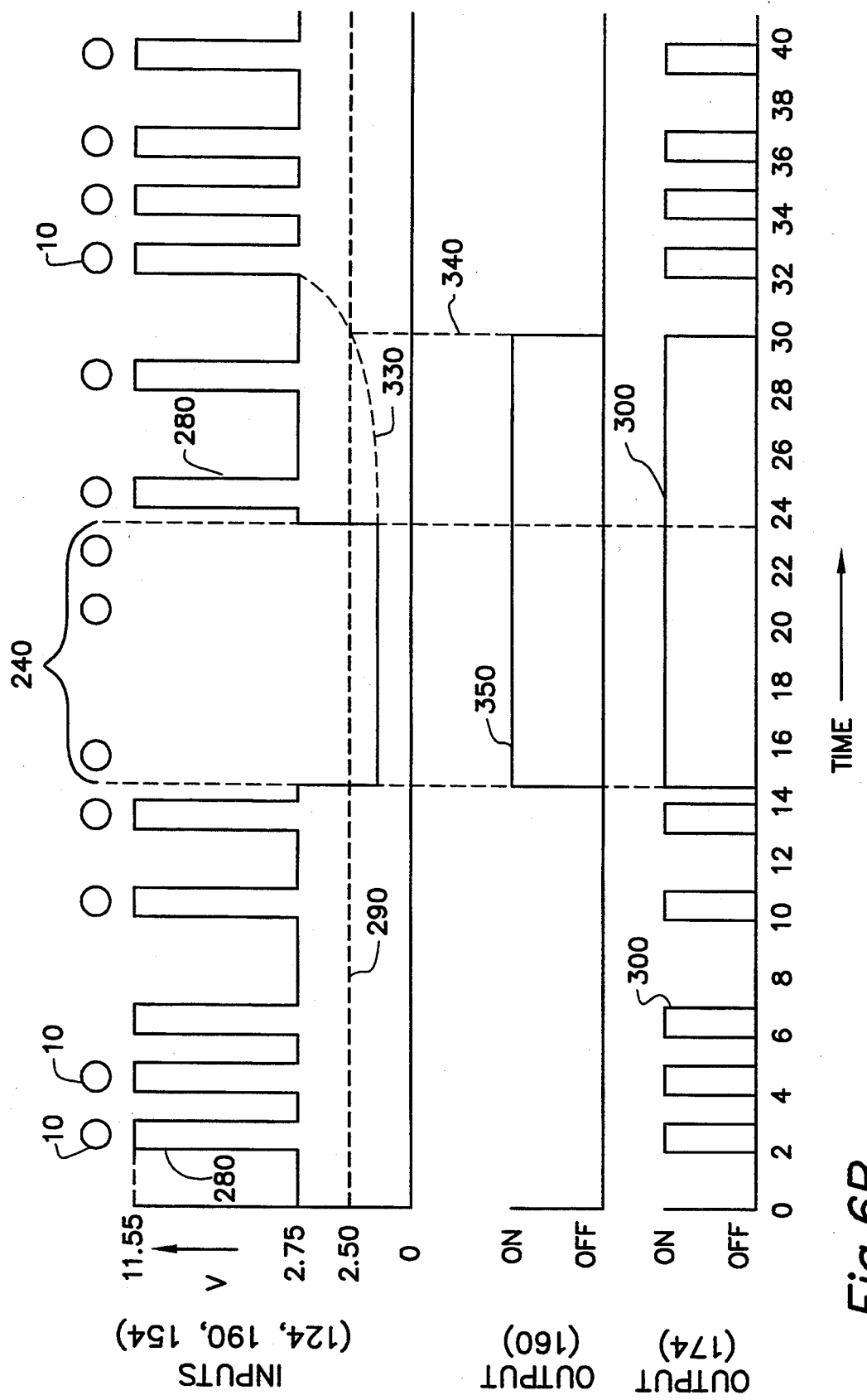
FIG. 6 illustrates several time-based signals at various preselected locations within the circuit of FIG. 5.

FIG. 6 shows a timing chart for several signals at preselected points in the circuit of FIG. 5. At the top of FIG. 6, numerous objects 10, represented as circular coins, are shown at various times on the chart. These representations are provided to illustrate the obstruction of the light beam 18 in FIG. 1 at selected times so that the operation of the circuit in FIG. 5 can more specifically be described. In addition, a period of time between time 14 and 24 is identified by bracket 240. Between the vertical dashed lines corresponding to bracket 240, an external light is received by the light sensitive component 106. It should be understood that the time related numerals at the bottom of FIG. 6 do not represent any particular unit of time but, instead, are intended to identify various occurrences illustrated in the time-based representation of FIG. 6.

The upper signal shown in FIG. 6 represents the voltage changes on line 120. As can be seen, the signal 250 at the inverting input of comparator 140 rises from a value of approximately 1.57 volts when no obstruction exists between the light emitting diode 114 and the light sensitive component 106 to a magnitude of approximately 10.2 volts when an obstruction exists in the detection zone to break the light beam between these components. Each time a coin passes through the detection zone between the light emitting diode and the light sensitive component, the voltage at the inverting input of comparator 140 is caused to rise. The normal operation of the circuit in FIG. 5 is represented between times T0 and T14. The output from comparator 140 on line 150 is represented by the second graphical illustration in FIG. 6. As can be seen, the signal 260 is on whenever signal 250 exceeds the reference voltage 270 on line 148 and at the noninverting input of comparator 140.

The third graphical representation from the top of FIG. 6 shows the signal 280 on line 124 and the reference voltage 290 on line 154. As can be seen between times T0 and T14, signal 280 alternates between a magnitude of 2.75 volts and 11.55 volts, depending on whether or not an object 10 breaks the light beam 18. However, regardless of the presence or absence of an object in the detection zone, the magnitude of signal 280 is always greater than the reference voltage 290 at the inverting input of comparator 142 which is set at 2.50 volts. Since the combination of comparator 140 and comparator 142 operate as an OR gate with respect to the base current of transistor 170, the output signal on line 174 can be represented as identified by reference numeral 300 at the bottom of FIG. 6 which follows signal 260 since the output of comparator 142 is always off between time T0 and time T14.

Between time T14 and time T15, an external light is caused to be received by the light sensitive component 106. The receipt of light by the photodarlington shown in FIG. 5 causes a decrease in its effective resistance and significantly reduces the voltage at the base of transistor 110. This, in turn, decreases the voltage at light emitting diode 114 and drops the voltage on line 120 from 1.57 volts to approximately 0.13 volts as shown between the dashed vertical lines associated with bracket 240 in the upper graph of FIG. 6. Since this drop in signal 250 maintains the signal voltage at the inverting input of comparator 142 significantly below the reference voltage 270 at its noninverting input, the output signal 260 on line 150 remains off. With reference to the third graphical representation from the top in FIG. 6, signal 280 is caused to drop from 2.75 volts to approximately 0.25 volts when the external light is received by the light sensitive component 106, beginning at the vertical dashed line between time T14 and T15 and extending beyond time T23. It should be understood that between times T0 and T23, the solid line identified by reference numeral 280 represents the voltage at lines 124 and 190 which are connected to the noninverting input of comparator 142. However, beginning at the L5 vertical dashed line which is shown between time T23 and time T24, dashed line 330 represents the voltage at line 190 which differs from the voltage to 280 at line 124. The reason for this difference in voltages, after the vertical dashed line between times T23 and T24, is that the capacitor 184 provides a time delay because of the time needed for it to charge from the 0.25 volt magnitude during the period identified by bracket 240 and the higher magnitude when line 124 increases in voltage potential as a result of the removal of the external light represented by bracket 240. The more gradual increase in voltage represented by dashed line 330 does not exceed the reference voltage 290 at the inverting input of comparator 142 until after time T30 as represented by dashed line 340. As can be seen in FIG. 6, the capacitor 184 delays the removal of output signal 350 on line 160 until long after the removal of the external light which is represented by bracket 240. This extension in time of signal 350 creates an unmistakably long signal that can easily be detected by external circuitry connected to line 174. Comparing the bottom two illustrations in FIG. 6, it can be seen that the extended period of time signal 350 creates an associated long signal 300 because of the OR relationship between comparators 140 LO and 142 and the signal on line 174. Because of the fact that capacitor 184 delays the output signal 300 on line 174 by a significant amount after the external light signal 240 is removed, even short duration pulses of an external light will be detected because the length of the short light pulses will be exaggerated significantly and extended by an amount that permits the abnormally long signals to be detected by associated circuitry connected to line 174. Although the external light 240 is represented in FIG. 6 as being a continuous source of light between times T14 and T24, it should be understood that tampering schemes could also incorporate modulated signals for the purpose of trying to deceive the circuitry associated with the gambling machine.

Figure 7:
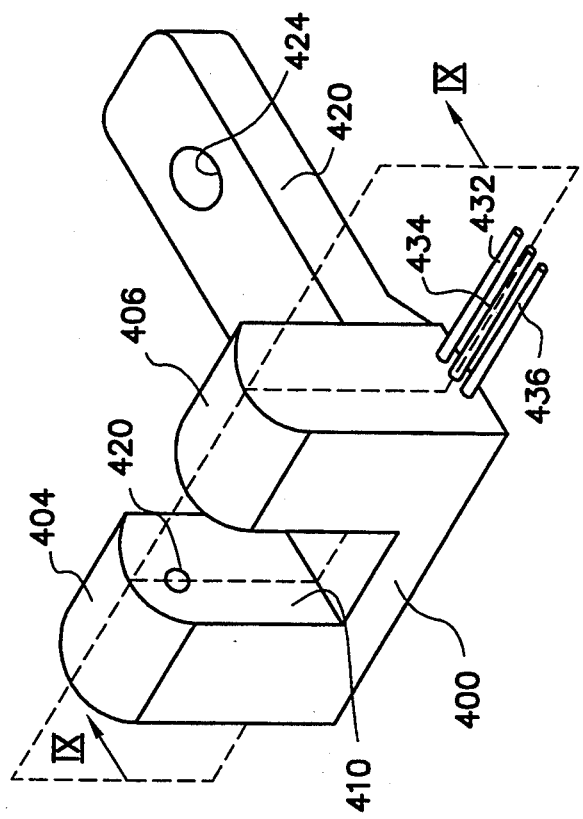
FIGS. 7 and 8 are perspective illustrations of the present invention.
Figure 8:
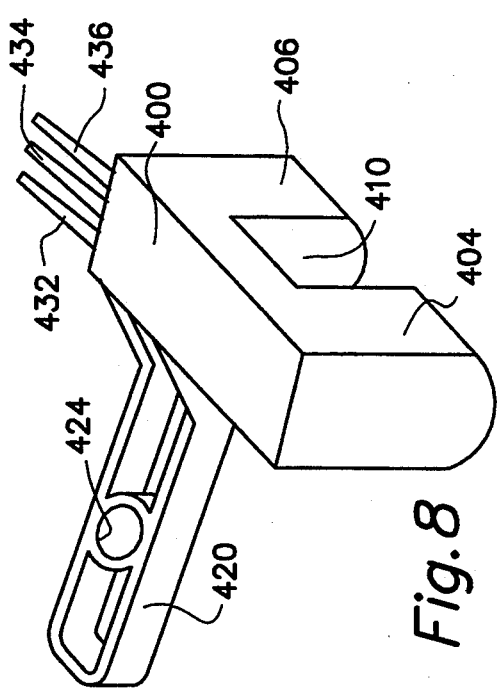
Figure 9:
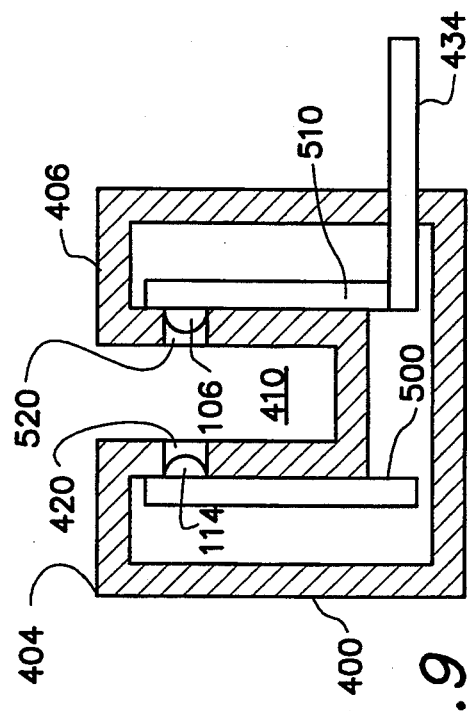
FIG. 9 is a sectional view of the illustration in FIG. 7.

The circuit of FIG. 5 is packaged in a manner which is suitable for use in an application such as that identified above in conjunction with FIG. 1. This is shown in FIGS. 7, 8 and 9. A housing 400 comprises a first portion 404 and a second portion 406 which are spaced apart to define a detection zone 410 therebetween. A light emitting diode is disposed in the first portion 404 and located at a position aligned with a small opening 420. A similar small opening 520 is provided in the second portion 406 and aligned with opening 420. These two openings define a line along which a light beam can pass from a light emitting diode to a light sensitive component disposed within the second portion 406. Therefore, an object passing through the detection zone 410 will obstruct the passage of light between these components and be sensed in a manner described above in association with FIG. 5. An extension 420 is attached to the housing 400 and provided with at least one mounting hole apparatus which is associated with the dispensing of objects, such as coins or documents. Electrical leads, 432, 434 and 436 are connected in electrical communication with the components enclosed within the housing 400 to provide a circuit such as that shown in FIG. 5.

FIGS. 7 and 8 are alternative perspective representations of the present invention and FIG. 9 is a sectioned view of the device shown in FIG. 7. It should be understood that many different types of configurations can be used to provide the circuit shown in FIG. 5. In FIG. 9, two substrates, 500 and 510, comprise the plurality of circuit components illustrated in FIG. 5. On substrate 500, light emitting diode 114 is aligned with opening 420 and, on substrate 510, light sensitive component 106 is aligned with opening 520.

TABLE I

| Reference | Type or Value | (Supplier) |
|---|---|---|
| 50 | SEP8708 | (Honeywell) |
| 52 | SDP8406 | (Honeywell) |
| 56 | NE567 | (Signetics) |
| 60 | 2N2222 | (Honeywell) |
| 74 | SEP8706 | (Honeywell) |
| 76 | SDP8406 | (Honeywell) |
| 80 | NE556 | (Signetics) |
| 82 | NE556 | (Signetics) |
| 102 | 30KΩ | |
| 106 | SDP8106 | (Honeywell) |
| 110 | 2N2222 | (Motorola) |
| 114 | SEP8706 | (Honeywell) |
| 140 | LM393 | (National Semiconductor) |
| 142 | LM393 | (National Semiconductor) |
| 170 | 2N2222 | (Motorola) |
| 186 | 1MΩ | |
| 188 | 1N4148 | (Phillips) |
| 210 | 10KΩ | |
| 212 | 3KΩ | |
| 214 | 330Ω | |
| 216 | 330Ω | |

TABLE I-continued

| Reference | Type or Value | (Supplier) |
| --- | --- | --- |
| 218 | 1N5222B | (Motorola) |

Although the present invention has been illustrated with significant specificity and a preferred embodiment of the present invention has been described with particular detail, it should be understood that many alternative embodiments of the present invention are possible within its scope. In addition, although the light emitting diode of the present invention has been described as an infrared light emitting diode, alternative light sources are possible. In addition, while the comparators used by the circuit in FIG. 5 have been associated with each other and with the remaining portions of the circuit to provide a particular type of signal in conformance with the requirements of external circuitry in a particular embodiment of the present invention, other component could be arranged in different associations with each other to satisfy different requirements.

The embodiments of the invention in which an exclusive property or right is claimed are defined as follows:

1. An optical detector, comprising:
   a light source;
   a light sensitive component disposed at a position to receive light from said light source;
   first means for comparing a first voltage at said light source to a first reference;
   means for regulating the intensity of light emanating from said light source as a function of the intensity of light received by said light sensitive component;
   second means for comparing a second voltage at said light source to a second reference;
   first means for providing a first signal when said first voltage exceeds said first reference;
   second means for providing a second signal when said second voltage is less than said second reference; and
   means for delaying a change in the level of said second signal upon an increase of said second voltage following a period of time when said second voltage was less than said second reference.

2. The detector of claim 1, wherein:
   said light source is a light emitting diode.

3. The detector of claim 2, wherein:
   said light sensitive component is a phototransistor.

4. The detector of claim 3, wherein:
   said regulating means comprises a transistor having a base connected in electrical communication with said phototransistor, said transistor being connected between a power supply and said light emitting diode, said phototransistor being connected between said power supply and ground potential.

5. The detector of claim 4, wherein:
   said phototransistor is a photodarlington pair.

6. The detector of claim 1, wherein:
   said first signal is representative of an obstruction of the light path between said light source and said light sensitive component.

7. The detector of claim 6, wherein:
   said second signal is representative of a light other than said light source emanating light that is being received by said light sensitive component.

8. An optical detector, comprising:
   a light source;
   a light sensitive component disposed at a position to receive light from said light source;
   first means for comparing a first voltage at said light source to a first reference;
   means for regulating the intensity of light emanating from said light source as a function of the intensity of light received by said light sensitive component, said regulating means comprising a transistor having a base connected in electrical communication with said phototransistor, said transistor being connected between a power supply and said light emitting diode, said phototransistor being connected between said power supply and ground potential;
   second means for comparing a second voltage at said light source to a second reference;
   first means for providing a first signal when said first voltage exceeds said first reference;
   second means for providing a second signal when said second voltage is less than said second reference;
   means for delaying a change in the level of said second signal upon an increase of said second voltage following a period of time when said second voltage was less than said second reference, said first signal being representative of an obstruction of the light path between said light source and said light sensitive component and said second signal being representative of a light other than said light source emanating light that is being received by said light sensitive component.

9. The detector of claim 8, wherein:
   said light source being a light emitting diode.

10. The detector of claim 8, wherein:
    said light sensitive component being a phototransistor and said phototransistor being a photodarlington pair.

* * * * *